United States Patent
Rau

(10) Patent No.: US 7,090,948 B2
(45) Date of Patent: Aug. 15, 2006

(54) REFLECTION MASK AND METHOD FOR FABRICATING THE REFLECTION MASK

(75) Inventor: Jenspeter Rau, München (DE)

(73) Assignee: Infineon Technologies AG, Munich (DE)

( * ) Notice: Subject to any disclaimer, the term of this patent is extended or adjusted under 35 U.S.C. 154(b) by 307 days.

(21) Appl. No.: 10/298,429

(22) Filed: Nov. 18, 2002

(65) Prior Publication Data
US 2003/0123605 A1 Jul. 3, 2003

(30) Foreign Application Priority Data
Nov. 6, 2001 (DE) .............................. 101 56 366

(51) Int. Cl.
*G03F 9/00* (2006.01)
(52) U.S. Cl. .............................. 430/5; 430/30; 382/144
(58) Field of Classification Search .................. 430/5, 430/30; 382/144
See application file for complete search history.

(56) References Cited

U.S. PATENT DOCUMENTS

| 5,928,817 A | 7/1999 | Yan et al. |
| 5,958,629 A * | 9/1999 | Yan et al. .................... 430/5 |
| 2001/0038953 A1 | 11/2001 | Tsukamoto et al. |

FOREIGN PATENT DOCUMENTS

| CA | 2287671 | 4/2001 |
| DE | 38 42 481 A1 | 6/1989 |

OTHER PUBLICATIONS

Liang, T. et al.: "Progress in Extreme Ultraviolet Mask Repair Using a Focused Ion Beam", American Vacuum Society, J. Vac. Sci. Technol. B 18 (6), Nov./Dec. 2000, pp. 3216-3220.
Bollepalli, B. S. et al.: "On the Computation of Reflected Images from Extreme Ultra Violet Masks", SPIE, vol. 3676, Mar. 1999, pp. 587-597.
Pistor, T. et al.: "Calculating Aerial Images from EUV Masks", SPIE, vol. 3676, Mar. 1999, pp. 679-696.
CharlesGwyn, et al.: "Extreme Ultraviolet Lithography", dated Nov. 1999, pp. 97-169.

* cited by examiner

*Primary Examiner*—Christopher G. Young
(74) *Attorney, Agent, or Firm*—Laurence A. Greenberg; Werner H. Stemer; Ralph E. Locher

(57) ABSTRACT

A reflection mask, preferably, an EUV reflection mask, for imaging a pattern that has or is formed on the mask onto a semiconductor wafer with extreme ultraviolet radiation or soft X-radiation includes a substrate, a reflection layer thereon reflecting incident radiation, an absorption layer thereon absorbing incident radiation, and a hard mask thereon of a material having an etching selectivity with respect to absorbent material of the absorption layer. After exposure and development of the resist, the pattern is transferred into the hard mask in a first etching step and the resist is removed, and inspection of the pattern in the hard mask detects defects in the hard mask. Defects can be repaired by FIB. Gallium ions are implanted in the absorption layer instead of in the reflection layer, rendering a buffer layer obsolete and allowing lower aspect ratios of trenches on the finished reflection mask.

17 Claims, 4 Drawing Sheets

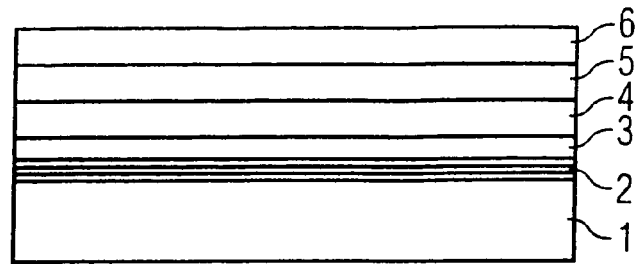
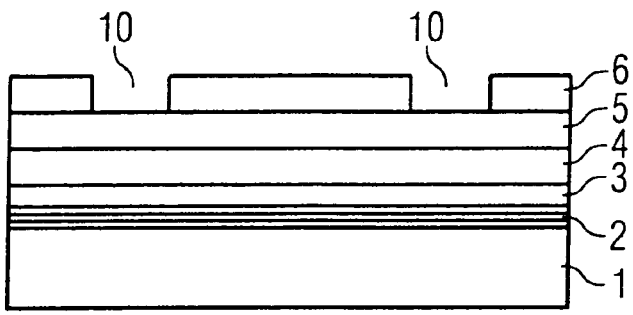
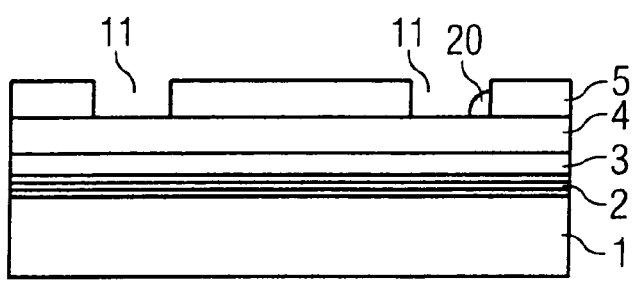
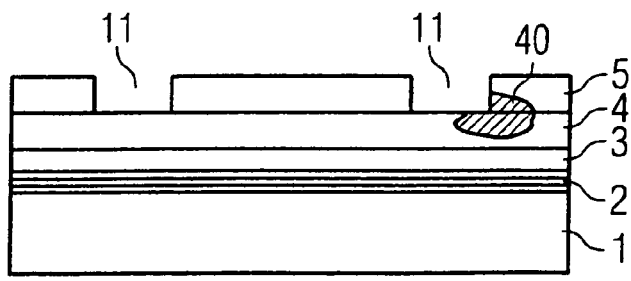
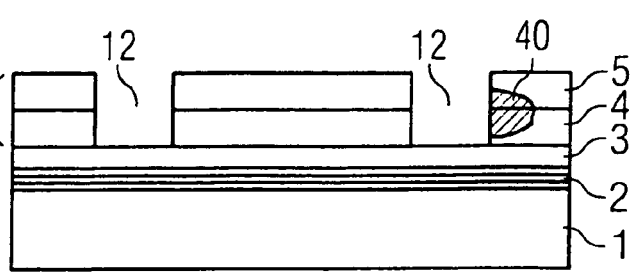

REFLECTION MASK AND METHOD FOR FABRICATING THE REFLECTION MASK

BACKGROUND OF THE INVENTION

Field of the Invention

The present invention relates to a reflection mask for imaging a structure that has been or is to be formed on the reflection mask onto a semiconductor wafer with the aid of extreme ultraviolet radiation or soft X-radiation, and to a method for fabricating the reflection mask.

Reflection masks that work in an extreme ultraviolet wavelength region or by soft X-radiation, also referred to below as EUV reflection masks, represent one group of main candidates for forming patterns on wafers with a minimum feature size of 70 nm and below. The pattern that is to be imaged on the wafer is formed on the reflection mask in the form of regions that absorb and reflect the radiation. At wavelengths of, for example, 11.2 nm or 13.3 nm, the light that is to be transmitted would be almost completely absorbed by the substrate even with minimum thicknesses of masked substrates that can be produced from conventional materials. Therefore, the reflection masks are irradiated with a slightly inclined beam, with an inclination of, for example 5–10 degrees, and the mask image is diverted through reflective mirrors onto the wafer in a reducing scale, the reducing factor typically being 4.

The reflective regions for imaging the structure are produced by an uncovered reflective layer that has been applied to the mask substrate. This reflective layer generally includes a layer stack in which extremely thin layers of a first element with a low atomic number and of a second element with a high atomic number are disposed alternately horizontally above one another. Examples include layer pairings of molybdenum and silicon or of molybdenum and beryllium. The number of layer pairings must be sufficiently great to achieve high reflectivities, for example, 40 to 70 layer pairings per stack. The maximum reflectivities that can be achieved, of approximately 80%, are wavelength-dependent.

The absorbent regions are formed as an absorption layer above the reflection layer. Standard materials are chromium or aluminum. Tantalum nitride or titanium nitride are also possible. As with conventional transmission masks, the patterns on the mask are formed by exposure or irradiation of a resist and by transferring the pattern so formed into the absorbent layer below it in an etching step. Often, a thin protective layer—for example, of silicon—is also disposed between the absorption layer and the reflection layer, serving as an end mark for the etching operation in the etching step so that the sensitive reflection layer that includes the layer stack is not damaged.

The etching steps may easily produce impurities or particles that are deposited as defects in the uncovered gaps on the reflection layer. These defects are detected in the inspection steps required for such a purpose and are etched away by a focused ion beam (FIB). Clear defects caused by parts of the absorption layer that have broken out or been etched away can also be repaired by FIB as a result of material being deposited in the corresponding regions of the absorption layer.

By way of example, a liquid gallium source is used to generate the ions. However, the ion bombardment of the absorption layer on the mask surface, disadvantageously, also causes gallium ions to be implanted into the layer below. In the case of the layer stack of the reflection layer, the gallium ions lead to a problematical loss of reflectivity in the top layers of the layer stack. Although a defect could be successfully repaired, the hoped-for success, i.e., that the uncovered location on the mask makes a contribution to the reflection in order to form the pattern on the wafer, is not achieved when the mask is used.

One solution to the problem of the layer stack of the reflection layer being destroyed is described, for example, by Liang, T. et al., J. Vac. Sci. Technol. B18 (6), pp. 3216 ff. (November/December 2000), in which an additional buffer layer is provided between the layer stack of the reflection layer and the absorption layer. In the example described, the absorption layer made from titanium nitride has a thickness of 100 nm and the buffer layer made from quartz ($SiO_2$) has a thickness of 50 to 70 nm. The buffer layer is used to protect the layer stack of the reflection layer while the absorber is being patterned and defects are being repaired. Therefore, the buffer material must have the property of having a good etching selectivity with respect to the absorber material. For quartz with respect to titanium nitride, this is achieved in plasma etching processes that are generally used.

The thickness of the buffer layer is determined by the penetration depth of the gallium ions and the condition that a sufficient deep-UV reflection contrast be maintained for inspection of the patterns, for example, 75 nm for $\lambda=257$ nm or 50 nm for $\lambda=193$ nm.

In the finished EUV reflection mask, a relatively deep trench is formed after the patterning of the absorption layer or the uncovering of the reflection regions, on account of the fact that the buffer layer is additionally enclosed between the absorption layer and the layer stack. As described, for example, in Bollepalli and Cerrina, SPIE Vol. 3676, pp. 587–597 (1999), and in Pistor and Neureuther, SPIE Vol. 3676, pp. 679–696 (1999), however, the thickness of the absorption layer plus the thickness of the buffer layer plays an important role for the reflected image with the EUV or X-radiation, which is incident on the mask with the trench at up to over 10 degrees. An obliquely exposed deep trench results in an asymmetrical intensity profile of the trench on the wafer, with the effect of a change in the line width and also a line shift, as can be seen correspondingly in FIGS. 1A and 1B. The deeper the trench or the thicker the absorption layer plus the buffer layer, the stronger the effect of these changes in the reflected image.

A reduction in the acceleration voltage in the FIB for the gallium ions in order to reduce the penetration depth has an adverse effect on the resolution of the ion beam so that this measure, too, is unable to achieve any improvement in quality. Feeding a lower charge into the ion beam also does not create a solution because the longer implantation time under the typically fluctuating ambient conditions leads to background noise in the positioning accuracy and, therefore, in the resolution of the FIB unit.

SUMMARY OF THE INVENTION

It is accordingly an object of the invention to provide a reflection mask and method for fabricating the reflection mask that overcome the hereinafore-mentioned disadvantages of the heretofore-known devices and methods of this general type and that keeps the thickness of the buffer layer as low as possible, this being subject to a strict lower limit on account of the above conditions, and that reduces the above-mentioned problems, in particular, reduces the trench depth in the finished reflection mask, whereas the layer stack of the reflection layer is sufficiently protected during fabrication.

With the foregoing and other objects in view, there is provided, in accordance with the invention, a reflection mask for imaging a structure one of having been formed and to be formed on the reflection mask onto a semiconductor wafer with aid of one of extreme ultraviolet radiation and soft X-radiation, including a substrate, a reflection layer for reflecting incident radiation, the reflection layer disposed at the substrate, an absorption layer of an absorbent material for absorbing incident radiation, the absorption layer disposed above the reflection layer, and a hard mask disposed above the absorption layer, the hard mask of a material having an etching selectivity with respect to the absorbent material of the absorption layer.

With the objects of the invention in view, there is also provided a method for fabricating a reflection mask for imaging a structure one of having been formed and to be formed on the reflection mask onto a semiconductor wafer with aid of one of extreme ultraviolet radiation and soft X-radiation, including the steps of providing a substrate coated at least with a substrate-side reflection layer for reflecting incident radiation, an absorption layer of an absorbent material for absorbing incident radiation disposed above the reflection layer, a hard mask of a material having an etching selectivity with respect to the absorbent material of the absorption layer disposed above the absorption layer, and a resist as a surface layer, exposing and developing the resist to form a pattern in the resist, transferring the pattern into the hard mask in a first etching step, removing the resist, performing an initial inspection of the pattern in the hard mask to detect defects in the hard mask, and transferring the pattern from the hard mask into the absorption layer in a second etching step.

According to the present invention, a new layer is disposed as a hard mask above the absorption layer, in which new layer patterning, inspection, and repair can be carried out, the absorption layer, itself, serving as an implantation buffer for the gallium ions. The absorption property of the absorption layer is not adversely affected by the absorbing gallium ions. By contrast, the sensitive layer stack of the reflection layer is not impaired. The patterning of the absorption layer is effected by transferring the pattern from the previously patterned hard mask. Such an etching process can be carried out with an extremely small number of defects. Defects that occur nevertheless can be detected individually using electron beam or AFM appliances and repaired.

A further advantage is that when selecting the materials for the individual layers, the majority of the attention can be paid to the needs of etching and inspection, while metrological aspects can be pushed into the background in the choice of materials.

A further advantage is brought about by the fact that the hard mask can be completely removed at the end because the additional layer is not disposed below the absorption layer, but, rather, above the absorption layer, at the surface on the reflection mask.

In accordance with another feature of the invention, a protective layer for ending an etching process is disposed between the reflection layer and the absorption layer, preferably, in each case directly adjacent thereto. Such a protective layer is usually referred to as an etching stop or an end mark for the etching. The layer is particularly thin and, therefore, has no adverse effect on either the reflection properties or the trench depth of the finished reflection mask. By contrast, it does offer the advantage of effectively indicating that the etching of the absorption layer above it has stopped. Therefore, the layer stack of the reflection layer is effectively protected.

In accordance with a further feature of the invention, the reflection layer and the absorption layer directly adjoin one another. In such a case, the particularly major advantage of the lowest possible aspect ratio for the trench of the finished reflection mask is achieved. The aspect ratio represents the ratio of trench depth to trench width. The buffer layer that has previously been used to offer protection against repair operations is no longer present between the reflection layer and the absorption layer. As a result, the low aspect ratio can be achieved. The hard mask according to the invention, nevertheless, simultaneously protects the layer stack of the reflection layer from the gallium ions In accordance with an added feature of the invention, the hard mask is formed from one or more of the materials quartz, carbon, ruthenium, and SiON. These are, in particular, materials for which it has also been possible to use for the buffer layer that has hitherto been disposed beneath the absorption layer. Unlike this layer, however, these materials are now disposed as a hard mask above the absorption layer.

The positive property of the etching selectivity with respect to the absorption layer is transferred from the buffer layer that has been used hitherto to the hard mask according to the invention and can be exploited in the same way. It is also possible to use other hard-mask materials, for example, those customarily used in wafer fabrication, for the present hard mask.

In accordance with an additional feature of the invention, the reflection layer is formed from an alternating configuration of layers in a layer stack, in particular, including molybdenum-silicon or molybdenum-beryllium. The configuration of the layers according to the invention has a particularly advantageous effect, in particular, with regard to maintaining and protecting the reflection property of the layer stack.

In accordance with yet another feature of the invention, the absorption layer is formed from one or more of the materials chromium, titanium nitride, tantalum nitride, and nickel. On the one hand, these elements or compounds provide particularly effective absorption properties, and, on the other hand, they allow an advantageous etching selectivity with respect to the materials of the hard mask. As a result, the patterning property is particularly advantageously improved.

In accordance with yet a further feature of the invention, the reflection layer is disposed directly on the substrate.

With the objects of the invention in view, there is also provided a reflection mask for imaging a structure thereon to a semiconductor wafer with aid of one of extreme ultraviolet radiation and soft X-radiation, including a substrate, a reflection layer for reflecting incident radiation, the reflection layer disposed at the substrate and having a reflection side facing away from the substrate, an absorption layer of an absorbent material for absorbing incident radiation, the absorption layer disposed at the reflection side and having an absorption side facing away from the substrate, and a hard mask disposed at the absorption side, the hard mask of a material having an etching selectivity with respect to the absorbent material of the absorption layer.

In accordance with yet an added mode of the invention, a repair of an opaque defect is carried out after the first inspection by removal of material in the hard mask outside the absorption layer. The absorption layer that rests on the layer stack of the reflection mask, therefore, remains unaffected, apart from the inherent ion implantation, during the repair. Therefore, the absorption layer implicitly serves as a buffer for the gallium ions in order to protect the reflection layer below.

In accordance with yet an additional mode of the invention, a repair of a clear defect is carried out by deposition of material in the hard mask on the absorption layer. In this step too, the sensitive reflection layer remains unaffected.

In accordance with again another mode of the invention, the hard mask is removed after the step of transferring the pattern from the hard mask to the absorption layer. This results in the particular advantage of permitting a low aspect ratio to be achieved. The particular complexity of data processing that provides the data for the lithographic writing unit can be simplified significantly in such a case because the necessary corrections for the line shifts and asymmetries in the intensity profile of lines during the reflection are much less extensive in the method according to the invention having the inventive layered configuration of the reflection mask, on account of the low aspect ratio. Moreover, the material properties of the hard mask material no longer have to be taken into account in the subsequent use for exposure of a wafer, etc.

In accordance with again a further mode of the invention, the second etching step is ended when a protective layer disposed between the absorption layer and the reflection layer is uncovered.

In accordance with a concomitant mode of the invention, a second inspection is carried out to detect defects after removal of the hard mask. Such an inspection has the advantage that defects that occur sporadically in the second etching step can also be detected and repaired. To preserve the reflection layer that is now uncovered, atomic force microscope (AFM) or scanning electron microscopes (SEMs), etc., are used for such a purpose.

With the objects of the invention in view, there is also provided a method for imaging a structure one of having been formed and to be formed on the reflection mask onto a semiconductor wafer with aid of one of extreme ultraviolet radiation and soft X-radiation which includes the step of utilizing the reflection mask according to claim 1 to form at least one pattern on the reflection mask.

With the objects of the invention in view, there is also provided a method for fabricating a reflection mask for imaging a structure one of having been formed and to be formed on the reflection mask onto a semiconductor wafer which includes the step of utilizing the reflection mask in claim 11 with at least one pattern formed thereon by at least one of exposing and irradiating the semiconductor wafer with extreme ultraviolet radiation or soft X-radiation.

The use of the EUV reflection mask that includes the layered configuration according to the invention to form a pattern on the reflection mask using the fabrication method according to the invention is particularly advantageous. If the EUV reflection mask set forth herein is, as yet, unpatterned, i.e., unexposed, according to the invention it also includes coated mask blanks that are provided with the layered configuration according to the invention.

The reflection mask that has been fabricated as described herein, with at least one pattern that has been formed, is particularly advantageously used to expose or irradiate a semiconductor wafer with extreme ultraviolet radiation or soft X-radiation. Particularly in this wavelength region, the materials and layer structures of the layer stack of the reflection layer required for such a purpose are particularly sensitive, and the previous removal of the hard mask facilitates matters because there is no need to take account of the properties of additional materials, such as carbon or quartz, under the irradiation conditions.

Other features that are considered as characteristic for the invention are set forth in the appended claims.

Although the invention is illustrated and described herein as embodied in a reflection mask and method for fabricating the reflection mask, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIGS. 2A to 2E are fragmentary, cross-sectional views of steps in a prior art method for fabrication of an EUV reflection mask using a buffer layer to protect a reflective layer stack.

DESCRIPTION OF THE PREFERRED EMBODIMENTS

Figure 1A:
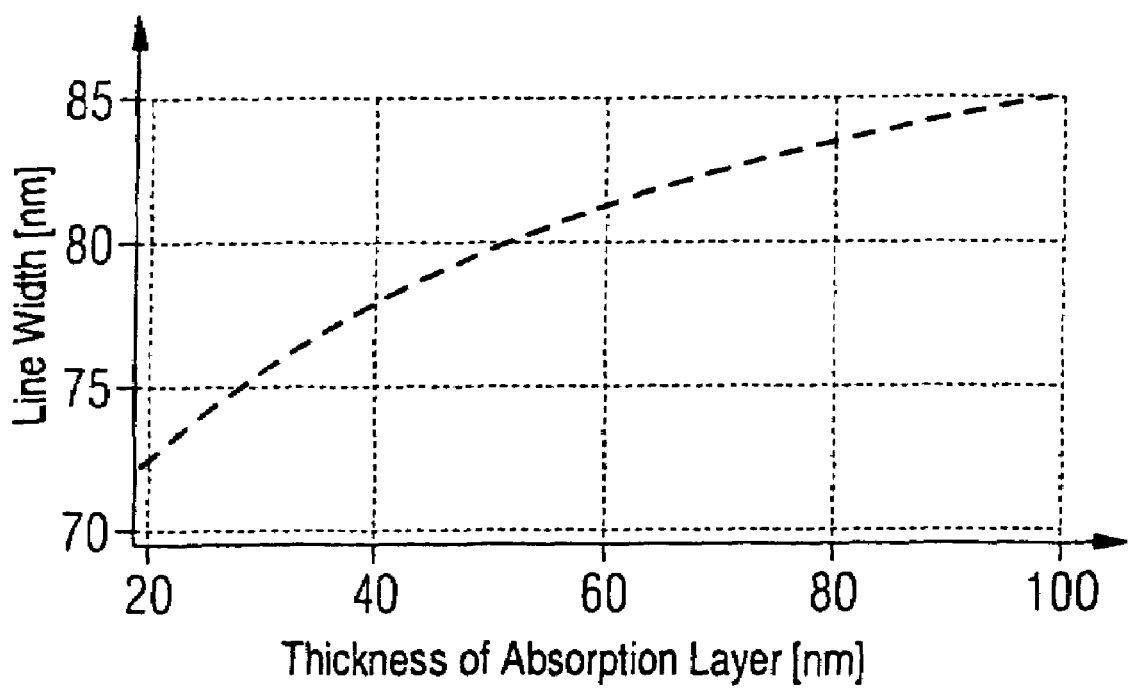
FIG. 1A is a graph illustrating a change in a line width as a function of a thickness of an absorption layer or a trench depth of an example of a reflection mask.
Figure 1B:
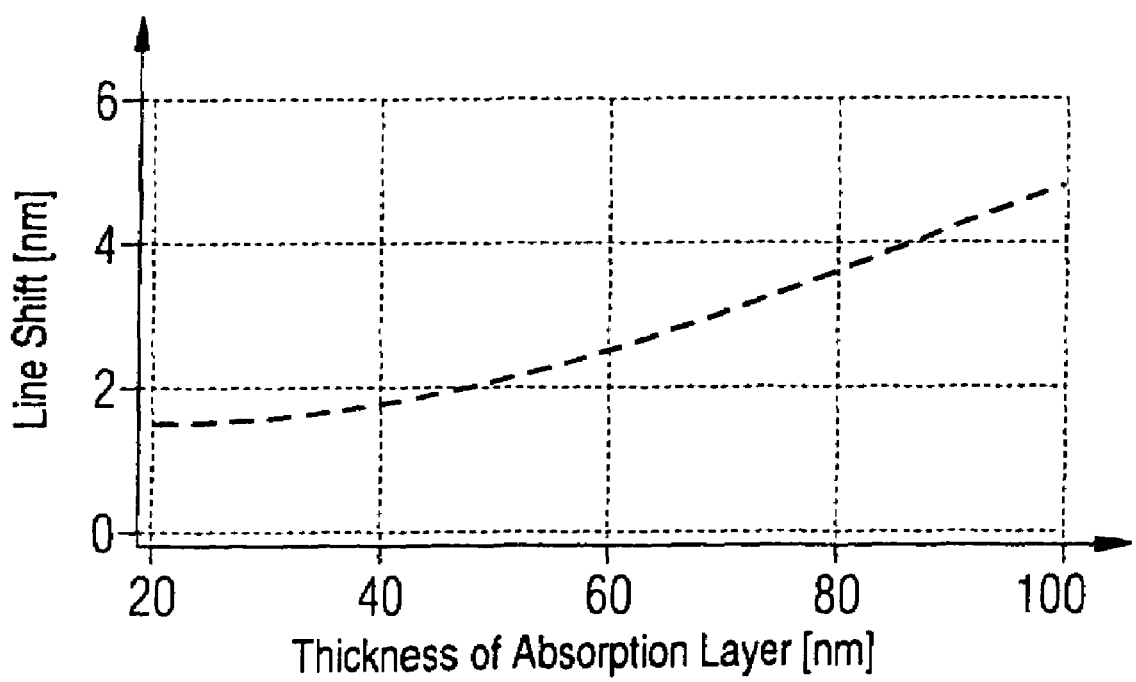
FIG. 1B is a graph illustrating a change in a line shift as a function of the thickness of the absorption layer or the trench depth of the example of a reflection mask.
Figure 3A:
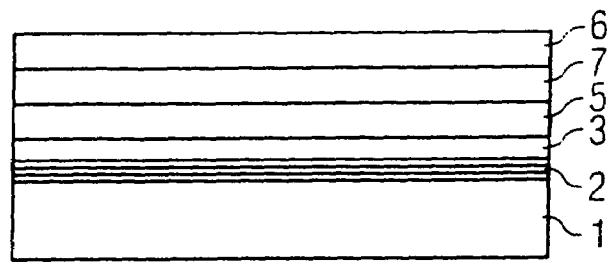
FIGS. 3A to 3F are fragmentary, cross-sectional views of steps in an exemplary embodiment of a method according to the invention for fabrication of an EUV reflection mask using a hard mask.
Figure 3B:
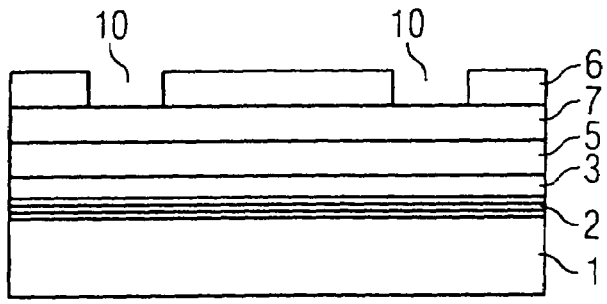
Figure 3C:
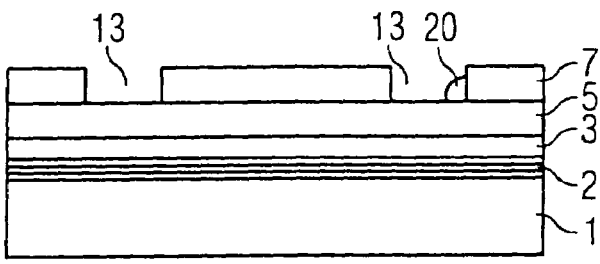
Figure 3D:
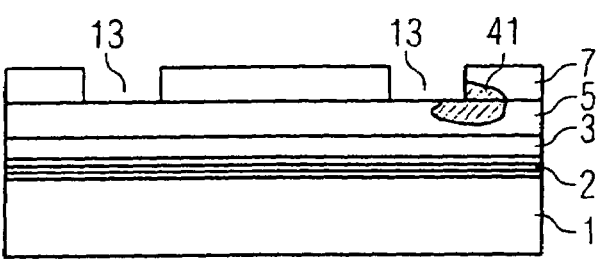
Figure 3E:
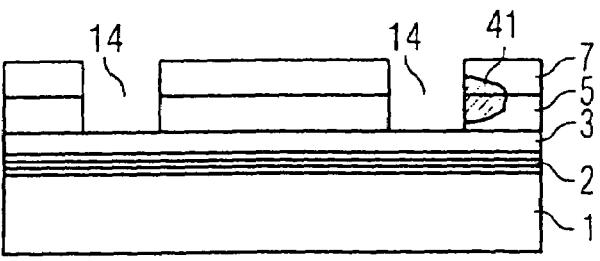
Figure 3F:
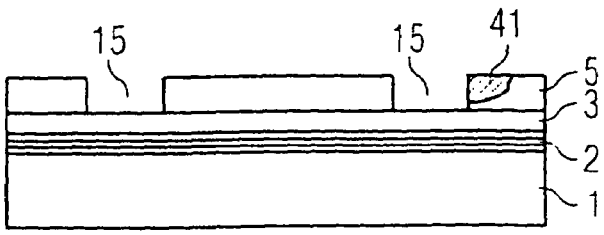
Figure 4:
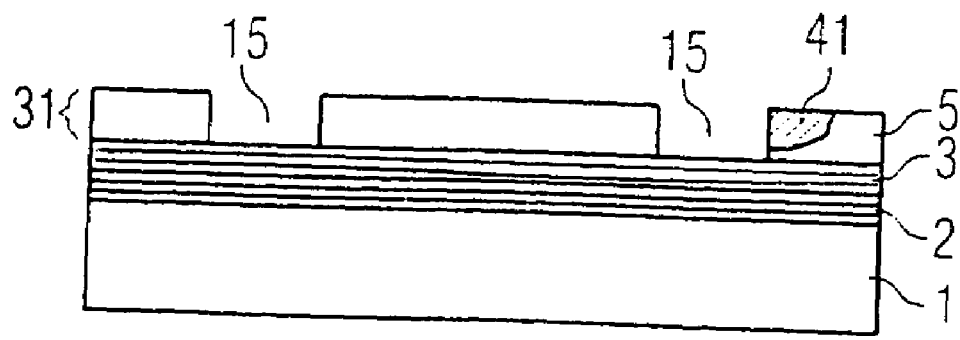
FIG. 4 is an alternative embodiment of the fragmentary cross-sectional view of FIG. 3F with the reflection and absorption layers adjoining one another.

Referring now to the figures of the drawings in detail and first, particularly to FIGS. 2A to 2E thereof, there is shown an example of a method for fabricating an EUV reflection mask in accordance with the prior art using a buffer layer to protect the layer stack of the reflection layer. The starting point is a layered configuration illustrated in FIG. 2A, for example, of a mask blank or of an EUV reflection mask that has already been coated as part of the fabrication method. A layer stack including alternating layers of molybdenum and silicon amounting to a total of 40 layer pairings, which forms the reflection layer 2, is disposed on the substrate 1. These layer pairings are only diagrammatically indicated in FIGS. 2A to 2E. Above the layer stack, there is a protective layer 3 consisting of silicon. A buffer layer 4 made from quartz ($SiO_2$) has in turn been deposited on the protective layer and is covered by the absorption layer 5, which is of titanium nitride. The configuration is covered by a resist layer 6 for the exposure with an electron beam. In FIG. 2B, two patterns 10 have been formed in the resist 6 after the exposure and development.

After a first etching step, in which the pattern 10 has been transferred from the resist 6 into patterns 11 in the absorption layer 5, the resist 6 is removed. An opaque defect 20 has been deposited on the buffer layer 4 in one of the patterns 11 in the absorption layer. See FIG. 2C. Then, an inspection and repair step is carried out, in which the opaque defect 20 is removed. In such a step, a zone with implanted gallium ions is formed in the buffer layer 4 in a region 40 at the location where the opaque defect 20 was previously to be found. See FIG. 2D. Then, in a second etching step, the pattern 11 is transferred into the buffer layer 4 to form a recessed structure 12. The buffer layer that is still present has a thickness of 50 nm and the titanium nitride absorption layer that is still present has a thickness of 100 nm. The trench depth 30 of the pattern 12 is, therefore, 15 nm. See FIG. 2E.

An example of the method and reflection mask according to the invention is shown in FIGS. 3A to 3F. As in the prior art, a layer stack including 40 pairs of thin molybdenum-silicon layers that forms the reflection layer 2 is positioned on a substrate 1. These layer pairings are only diagrammatically indicated in FIGS. 3A to 3E. The layer stack is covered by a protective layer 3 of silicon. Immediately above the protective layer 3 is the absorption layer 5 made from titanium nitride, and above this is the hard mask made from quartz. The resist 6 is used to form patterns. See FIG. 3A. Patterns 10 are formed in the resist 6 by exposure and development (see FIG. 3B), after which, in a first etching step, the patterns 10 are transferred into patterns 13 in the hard mask 7. It is assumed that in this case, too, an opaque defect 20 has been deposited on the absorption layer 5 in the pattern 13 in the hard mask 7. See FIG. 3C.

The opaque defect 20 is removed in an inspection and repair step by FIB. In such a step, gallium ions are implanted in an implantation region 41. See FIG. 3D. In a second etching step, the pattern 13 in the hard mask 7 is transferred to the absorption layer 5. Etching stops at the protective layer 3. See FIG. 3E. Then, the hard mask 7 is removed. As a result, the deep structures 14 are converted into shallower structures 15. These have a trench depth 31 of 100 nm, corresponding to the thickness of the titanium nitride absorption layer 5. The quartz hard mask 7 had a thickness of 20 nm.

Both in the example according to the prior art and in the example according to the invention, the layer stacks of the reflection layer 2 are protected against implantation ions. The resulting aspect ratio according to the example according to the invention is, however, a third lower than the aspect ratio according to the prior art. Such a difference allows lower biasing during the data processing and also higher positioning accuracy of the lines according to the present invention.

It is also possible to leave the hard mask 7 on the absorption layer 5, specifically if the hard mask 7 is sufficiently thin and the material of the hard mask 7 transmits radiation, so that the absorption layer 5 below it can provide its full absorbent property. In such a case, the trench depth 31 is 120 nm, compared to 155 nm for the trench depth 30 according to the prior art.

Figure 5:
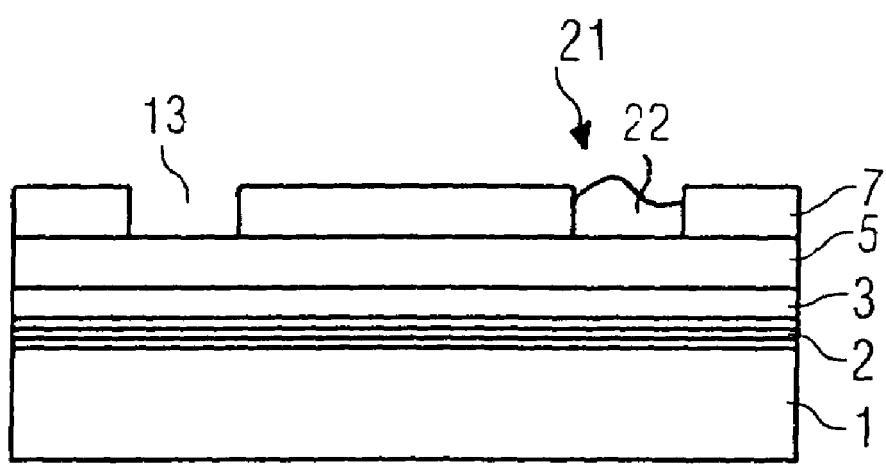
FIG. 5 is an alternative embodiment of the fragmentary cross-sectional view illustrating the present method with regard to depositing material to remove a clear defect.

An embodiment of removing a clear defect 21 instead of an opaque defect 20 is displayed in FIG. 5. For this purpose material 22 is deposited onto the clear defect structure within the hard mask layer on the absorption layer.

I claim:

1. A reflection mask for imaging a structure having been formed or to be formed on the reflection mask onto a semiconductor wafer with aid of extreme ultraviolet radiation or soft X-radiation, comprising:
   a substrate;
   a reflection layer for reflecting incident radiation, said reflection layer disposed at said substrate;
   an absorption layer of an absorbent material for absorbing incident radiation, said absorption layer disposed above said reflection layer; and
   a hard mask disposed above said absorption layer, said hard mask formed of a material containing at least one component selected from a group consisting of carbon, ruthenium and SiON having an etching selectivity with respect to said absorbent material of said absorption layer.

2. The reflection mask according to claim 1, including a protective layer for ending an etching process, said protective layer disposed between and directly adjacent said reflection layer and said absorption layer.

3. The reflection mask according to claim 1, including a protective layer for ending an etching process, said protective layer disposed between said reflection layer and said absorption layer.

4. The reflection mask according to claim 1, wherein said reflection layer and said absorption layer directly adjoin one another.

5. The reflection mask according to claim 1, wherein said reflection layer is formed from an alternating configuration of layers in a layer stack.

6. The reflection mask according to claim 5, wherein said reflection layer is of a material selected from at least one of a group consisting of molybdenum-silicon and molybdenum-beryllium.

7. The reflection mask according to claim 6, wherein said absorption layer is formed from material containing at least one component selected from a group consisting of chromium, titanium nitride, tantalum nitride, and nickel.

8. The reflection mask according to claim 1, wherein said reflection layer is disposed directly on said substrate.

9. A method for imaging a structure having been formed or to be formed on the reflection mask onto a semiconductor wafer with aid of extreme ultraviolet radiation or soft X-radiation which comprises utilizing the reflection mask according to claim 1 to form at least one pattern on the semiconductor wafer.

10. A reflection mask for imaging a structure thereon to a semiconductor wafer with aid of extreme ultraviolet radiation or soft X-radiation, comprising:
    a substrate;
    a reflection layer for reflecting incident radiation, said reflection layer disposed at said substrate and having a reflection side facing away from said substrate;
    an absorption layer of an absorbent material for absorbing incident radiation, said absorption layer disposed at said reflection side and having an absorption side facing away from said substrate; and
    a hard mask disposed at said absorption side, said hard mask formed of a material containing at least one component selected from a group consisting of carbon, ruthenium and SiON having an etching selectivity with respect to said absorbent material of said absorption layer.

11. A method for fabricating a reflection mask for imaging a structure having been formed or to be formed on the reflection mask onto a semiconductor wafer with aid of extreme ultraviolet radiation or soft X-radiation, which comprises:
    providing a substrate coated at least with a substrate-side reflection layer for reflecting incident radiation, an absorption layer of an absorbent material for absorbing incident radiation disposed above the reflection layer, a hard mask of a material having an etching selectivity with respect to the absorbent material of the absorption layer disposed above the absorption layer, and a resist as a surface layer;
    exposing and developing the resist to form a pattern in the resist;

transferring the pattern into the hard mask in a first etching step;

removing the resist;

performing an initial inspection of the pattern in the hard mask to detect defects in the hard mask;

carrying out any repair of an opaque defect after the initial inspection by removal of material in the hard mask outside the absorption layer;

carrying out any repair of a clear defect by deposition of material in the hard mask on the absorption layer;

transferring the pattern from the hard mask into the absorption layer in a second etching step; and removing the hard mask after the step of transferring the pattern from the hard mask to the absorption layer.

12. The method according to claim 11, which further comprises:

providing a protective layer between the absorption layer and the reflection layer; and ending the second etching step when the protective layer is at least partially uncovered.

13. The method according to claim 11, which further comprises:

providing a protective layer between the absorption layer and the reflection layer; and ending the second etching step when the protective layer is at least partially uncovered.

14. The method according to claim 11, which further comprises:

providing a protective layer between the absorption layer and the reflection layer; and ending the second etching step when the protective layer is at least partially uncovered.

15. The method according to claim 11, which further comprises:

providing a protective layer between the absorption layer and the reflection layer; and ending the second etching step when the protective layer is at least partially uncovered.

16. The method according to claim 11, which further comprises carrying out a second inspection to detect defects after removal of the hard mask.

17. A method for utilizing a reflection mask for imaging a structure having been formed or to be formed on the reflection mask onto a semiconductor wafer which comprises utilizing the reflection mask in claim 11 with at least one pattern formed thereon by at least one of exposing and irradiating the semiconductor wafer with extreme ultraviolet radiation or soft X-radiation.

* * * * *

UNITED STATES PATENT AND TRADEMARK OFFICE
CERTIFICATE OF CORRECTION

| | | |
|---|---|---|
| PATENT NO. | : 7,090,948 B2 | Page 1 of 1 |
| APPLICATION NO. | : 10/298429 | |
| DATED | : August 15, 2006 | |
| INVENTOR(S) | : Jenspeter Rau | |

It is certified that error appears in the above-identified patent and that said Letters Patent is hereby corrected as shown below:

Title Page: Item 30,

Date : "Nov. 6. 2001" should read -- Nov. 16, 2001 --

Signed and Sealed this

First Day of May, 2007

JON W. DUDAS
*Director of the United States Patent and Trademark Office*